United States Patent [19]
Gardner et al.

[11] Patent Number: 6,127,284
[45] Date of Patent: *Oct. 3, 2000

[54] METHOD OF MANUFACTURING A SEMICONDUCTOR DEVICE HAVING NITROGEN-BEARING OXIDE GATE INSULATING LAYER

[75] Inventors: Mark I Gardner, Cedar Creek; Mark C. Gilmer, Austin, both of Tex.

[73] Assignee: Advanced Micro Devices, Inc., Sunnyvale, Calif.

[*] Notice: This patent is subject to a terminal disclaimer.

[21] Appl. No.: 08/993,416

[22] Filed: Dec. 18, 1997

[51] Int. Cl.⁷ .................................................. H01L 21/469
[52] U.S. Cl. ......................... 438/787; 438/723; 438/788; 438/792
[58] Field of Search ..................................... 438/787, 564, 438/560, 517, 476; 458/725, 788, 792

[56] References Cited

U.S. PATENT DOCUMENTS

| | | | |
|---|---|---|---|
| 5,296,411 | 4/1993 | Gardner et al. | 438/476 |
| 5,719,065 | 9/1994 | Takemura et al. | 438/517 |

*Primary Examiner*—David Nelms
*Assistant Examiner*—Renee' R. Berry

[57] ABSTRACT

A semiconductor device having a nitrogen-bearing oxide gate insulating layer and methods of manufacture thereof are disclosed. A semiconductor device is formed by selecting a nitrogen-bearing species capable of providing a desired depth-distribution of nitrogen when an oxide layer is formed using the nitrogen-bearing species. The oxide layer is formed over a substrate, the oxide layer having the desired depth-distribution of nitrogen. A part of the oxide layer is selectively removed, giving the oxide layer a resultant depth-distribution of nitrogen. In accordance with another aspect of the process, a semiconductor device is formed by forming, in a reaction chamber, an oxide layer including nitrogen-bearing species on a substrate. A part of the oxide layer is selectively removed in the same reaction chamber.

26 Claims, 2 Drawing Sheets

METHOD OF MANUFACTURING A SEMICONDUCTOR DEVICE HAVING NITROGEN-BEARING OXIDE GATE INSULATING LAYER

FIELD OF THE INVENTION

The present invention is directed generally to semiconductor devices, and more particularly to semiconductor devices having a nitrogen-bearing oxide gate insulating layer and methods of manufacture thereof.

BACKGROUND OF THE INVENTION

Over the last few decades, the electronics industry has undergone a revolution by the use of semiconductor technology to fabricate small, highly integrated electronic devices. The most common semiconductor technology presently used is silicon-based. A large variety of semiconductor devices have been manufactured having various applicability and numerous disciplines. One such silicon-based semiconductor device is a metal-oxide-semiconductor (MOS) transistor.

The principal elements of a typical MOS semiconductor device are illustrated in FIG. 1. The device generally includes a gate electrode 101, which acts as a conductor, to which an input signal is typically applied via a gate terminal (not shown). Heavily doped source 103 and drain 105 regions are formed in a semiconductor substrate 107 and are respectively connected to source and drain terminals (not shown). A channel region 109 is formed in the semiconductor substrate 107 beneath the gate electrode 101 and separates the source 103 and drain 105 regions. The channel is typically lightly doped with a dopant type opposite to that of the source 103 and drain 105 regions. The gate electrode 101 is physically separated from the semiconductor substrate 107 by an insulating layer 111, typically an oxide layer such as $SiO_2$. The insulating layer 111 is provided to prevent current from flowing between the gate electrode 101 and the semiconductor source region 103, drain region 105 or channel region 109.

In operation, an output voltage is typically developed between the source and drain terminals. When an input voltage is applied to the gate electrode 101, a transverse electric field is set up in the channel region 109. By varying the transverse electric field, it is possible to modulate the conductance of the channel region 109 between the source region 103 and drain region 105. In this manner an electric field controls the current flow through the channel region 109. This type of device is commonly referred to as a MOS field-effect-transistors (MOSFET).

Semiconductor devices, like the one described above, are used in large numbers to construct most modern electronic devices. In order to increase the capability of such electronic devices, it is necessary to integrate even larger numbers of such devices into a single silicon wafer. As the semiconductor devices are scaled down (i.e., made smaller) in order to form a larger number of devices on a given surface area, the structure of the devices and fabrication techniques used to make such devices must be altered.

One important step in the manufacture of MOS devices is the formation of the gate oxide layer. The gate oxide layer is typically grown in active regions of the device. In order to obtain a high-quality gate oxide layer, the surface of the active area is often wet-etched to remove any residual oxide. The gate oxide layer is then grown slowly, typically through dry oxidation. It is important to carefully control the growth of the gate oxide layer because the thickness and uniformity of the gate oxide layer can significantly impact the overall operation of the device being formed. For example, the drain current in a MOS transistor is inversely proportional to the gate-oxide thickness at a given set of terminal voltages. Accordingly, it is normally desired to make the gate oxide as thin as possible, taking into consideration the oxide breakdown and reliability considerations of the process and technology being used.

The above described conventional techniques for forming gate oxide layers impose limitations on the minimum thickness of the gate oxide layer and on the ability to control the uniformity of the gate oxide layer. As the thresholds for minimum thickness and uniformity control are reached, the ability to further scale down the semiconductor devices is hindered.

SUMMARY OF THE INVENTION

Generally, the present invention relates to semiconductor devices having a nitrogen-bearing oxide gate insulating layer and methods of manufacture thereof. Consistent with the present invention a semiconductor device is formed by selecting a nitrogen-bearing species capable of providing a desired depth-distribution of nitrogen when an oxide layer is formed using the nitrogen-bearing species. The oxide layer is formed over a substrate, the oxide layer having the desired depth-distribution of nitrogen. A part of the oxide layer is selectively removed, giving the oxide layer a resultant depth-distribution of nitrogen.

In accordance with another aspect of the invention a semiconductor device is formed by forming, in a reaction chamber, an oxide layer including nitrogen-bearing species on a substrate. A part of the oxide layer is selectively removed in the same reaction chamber.

The above summary of the present invention is not intended to describe each illustrated embodiment or every implementation of the present invention. The figures and the detailed description which follow more particularly exemplify these embodiments.

BRIEF DESCRIPTION OF THE DRAWINGS

The invention may be more completely understood in consideration of the following detailed description of various embodiments of the invention in connection with the accompanying drawings, in which.

Figure 1:
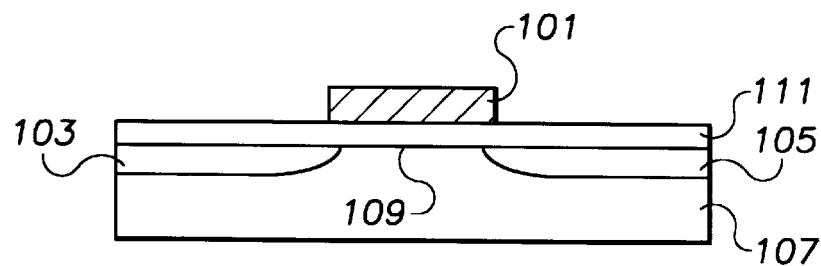
FIG. 1 illustrates components of a MOS semiconductor device.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention as defined by the appended claims.

DETAILED DESCRIPTION OF THE VARIOUS EMBODIMENTS

The present invention is believed to be applicable to a number of semiconductor devices which have a gate electrode disposed on an oxide layer. The invention is believed to be particularly advantageous in applications where it is desirable to form a gate oxide layer having a predetermined depth-distribution of nitrogen. While the present invention is not so limited, an appreciation of various aspects of the invention is best gained through a discussion of various application examples of processes used to form such semiconductor devices.

Figure 2A:
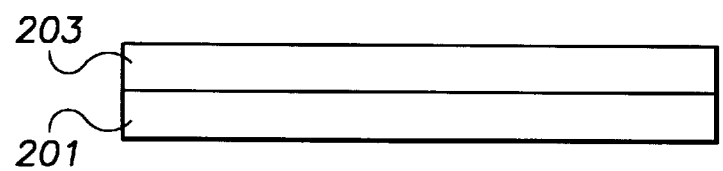
FIGS. 2A–2D illustrate an exemplary process in accordance with one embodiment of the invention.

FIGS. 2A–2D illustrate an exemplary process for fabricating a semiconductor device in accordance with one embodiment of the invention. In this process, a nitrogen-bearing oxide layer 203 is formed on a substrate 201, typically a silicon substrate, as illustrated in FIG. 2A. The nitrogen-bearing oxide layer 203 may be formed by growing an oxide in an ambient of one or more nitrogen-bearing species, such as N, $N_2$, $N_2O$ or $NH_3$. The particular characteristics of the nitrogen-bearing ambient are selected in consideration of the desired nitrogen profile of the nitrogen-bearing oxide layer 203. This will be discussed further below. As will also be discussed below, a top portion of the nitrogen-bearing oxide layer 203 will be removed to form a thin oxide layer. The initial thickness of the nitrogen-bearing oxide layer 203 is typically chosen in consideration of this oxide removal step. Suitable thicknesses of the nitrogen-bearing oxide layer 203 range from 20 to 30 Å for many applications.

The ambient of nitrogen-bearing species is purposefully chosen according to the desired depth-distribution of nitrogen in the nitrogen-bearing oxide layer 203. As used herein, the depth-distribution of nitrogen is the concentration of nitrogen as a function of depth relative to the upper surface of the nitrogen-bearing oxide layer 203. For example, growing an oxide layer over a substrate in a NO-ambient typically provides a generally Gaussian depth-distribution of nitrogen. Growing an oxide layer over a substrate in an $N_2O$-ambient typically provides a depth-distribution of nitrogen with a maximum at a surface of the nitrogen-bearing oxide layer 203 adjacent the substrate 201. As should be appreciated, other nitrogen depth-distributions may be provided by using different nitrogen-bearing species or by mixing nitrogen-bearing species.

The nitrogen-bearing oxide layer 203 may be grown in a number of different reaction chambers. Suitable reaction chambers include a diffusion tube or single chamber rapid thermal anneal (RTA) chamber. For example, the nitrogen-bearing oxide layer 203 may be grown in a diffusion tube by heating the substrate at about 800–1,000° C. for about 5–20 minutes. As another example, this layer may be grown in a single chamber RTA by annealling the substrate 201 at about 800–1,100° C. for about 10–60 seconds.

Figure 2B:
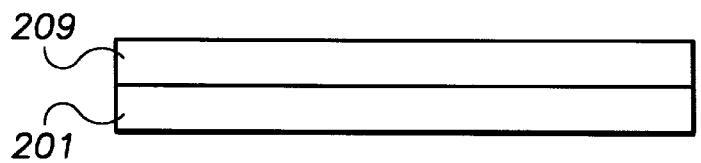

A part of the nitrogen-bearing oxide layer 203 is selectively removed to form a thinner nitrogen-bearing oxide layer 209, as illustrated in FIG. 2B. The oxide removal step may be performed using any of a number of different techniques. In one particular embodiment, the nitrogen-bearing oxide layer 203 is selectively removed by dipping the nitrogen-bearing oxide layer 203 in a hydrofluoric acid solution, e.g., a 10:1 H:F solution. In another embodiment, the nitrogen-bearing oxide layer 203 is partially removed by etching the nitrogen-bearing oxide layer 203 using, e.g., a plasma etching technique or a buffered oxide etching technique.

The partial removal of the oxide layer 203 may be performed in a number of different reaction chambers. Suitable reaction chambers include a plasma etch chamber or a single chamber RTA. Advantageously, the partial removal of the oxide layer 203 may be performed in-situ with (i.e., in the same reaction chamber as) the growth of the oxide layer 203. For example, both oxide growth and selective oxide removal may be carried out in a single chamber RTA reaction chamber. As should be appreciated, when using an in-situ process of oxide growth and partial removal, the reaction chamber is typically purged using an inert gas between the two steps.

The amount of oxide removed is typically chosen in consideration of the desired resultant depth-distribution of nitrogen, and the desired resulting thickness of the oxide layer 209. For example, when the oxide layer 203 has a Gaussian depth-distribution of nitrogen, selectively removing substantially half or more of the oxide layer 203 will provide a resultant oxide layer 209 with a depth-distribution of nitrogen which has a maximum at a top surface of the oxide layer 209. When the oxide layer 203 has a depth-distribution of nitrogen with a maximum at a surface of the nitrogen-bearing oxide layer 203 adjacent the substrate 201, selectively removing a part of the nitrogen-bearing oxide layer 203 will provide a resultant oxide layer 209 with a depth-distribution of nitrogen which has a maximum at a surface of the oxide layer 209 adjacent the substrate 201. The resulting oxide layer 209 may, for example, have a thickness ranging from about 5 to 15 Å. The resulting oxide layer 203 is typically used, at least in part, as a gate insulating layer.

Figure 2C:
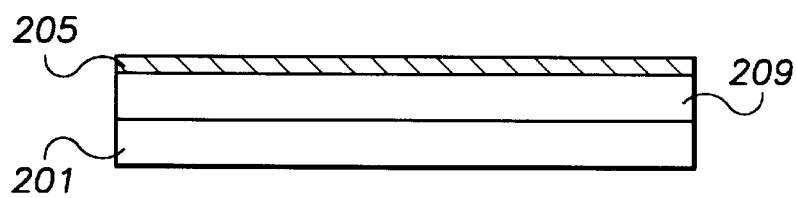

A second dielectric layer, such as a nitride layer 205, may optionally be formed over the oxide layer 209, as illustrated in FIG. 2C. In such cases the oxide layer 209 and the second dielectric layer will function as the gate insulating layer of a gate electrode. The nitride layer may be formed using, for example, well-known deposition techniques. Advantageously, the nitride layer 205 may be formed in-situ with the selective removal of the nitrogen-bearing oxide layer 203 or both the selective removal of the oxide layer 203 and the growth of the oxide layer 203. For example, each of these steps may be carried out in a single chamber RTA. In alternate embodiments, the nitride layer 205 may be omitted.

Figure 2D:
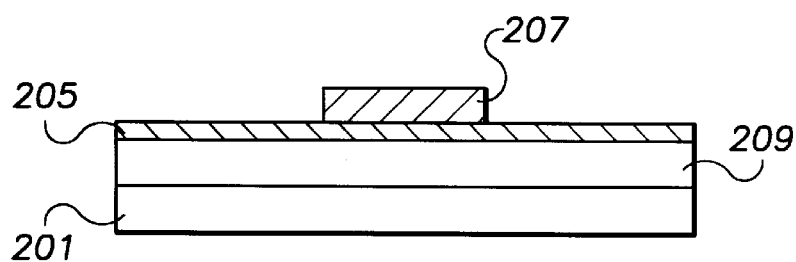

One or more gate electrodes (only one of which is shown) are typically formed over the nitride layer 205, as illustrated in FIG. 2D. The gate electrode 207 may be formed from a number of different materials including, for example, metal or polysilicon. In embodiments without the nitride layer 205, the gate electrode 207 may be formed directly in the thin oxide layer 209. The gate electrode 207 may be formed using, for example, well-known deposition, masking, and etching techniques.

Fabrication of the semiconductor device may continue with well-known processing steps such as source/drain formation, silicidation, contact formation, and so forth, to complete the device structure. For example, source/drain regions may be formed adjacent the gate electrode 207 by implanting dopants (e.g. boron or arsenic) into the substrate 201 using the gate electrode 207 for alignment. This may be performed by implanting the dopants through the oxide layer 209 (and optional nitride layer 205) or by removing these layers and then implanting the dopants. The formation of the source/drain regions may be done using well-known techniques.

Using the above processes, a semiconductor device is formed, having a nitrogen-bearing oxide layer with a predetermined nitrogen depth-distribution. Forming the resulting oxide layer by a selective oxide removal allows the thickness and uniformity of the resulting oxide layer to be controlled with greater precision. Also, a nitrogen-bearing gate oxide layer has improved reliability and gives enhanced device performance. The advantages of a nitrogen-bearing gate insulating layer are more specifically discussed in U.S. patent application Ser. No. 08/825,029, entitled "SEMICONDUCTOR DEVICE HAVING GATE OXIDE FORMED BY SELECTIVE OXIDE REMOVAL AND METHOD OF MANUFACTURE THEREOF", filed Mar. 26, 1997, the contents of which are incorporated herein by reference. The present invention is applicable to the fabrication of a number of different devices which may benefit from having a nitrogen-bearing gate insulating layer. Such devices include, but are not limited to, MOS, CMOS, and BiCMOS structures. Accordingly, the present invention cannot be considered limited to the particular examples described above, but rather should be understood to cover all aspects of the invention as fairly set out in the attached claims. Various modifications, equivalent processes, as well as numerous structures to which the present invention may be applicable will be readily apparent to those of skill in the art to which the present invention is directed, upon review of the present specification. The claims are intended to cover such modifications and devices.

What is claimed is:

1. A process of fabricating a semiconductor device, comprising:

selecting a nitrogen-bearing species capable of providing a desired depth-distribution of nitrogen when an oxide layer is formed using the nitrogen-bearing species;

forming the oxide layer having the desired depth-distribution over a substrate, the oxide layer being formed using the selected nitrogen-bearing species; and selectively removing a part of the oxide layer.

2. The process of claim 1, wherein selecting a nitrogen-bearing species includes selecting one or more of N, $N_2$, NO, $N_2O$, and $NH_3$.

3. The process of claim 1, wherein forming the oxide layer includes growing oxide over the substrate in an ambient containing the nitrogen-bearing species.

4. The process of claim 1, wherein selectively removing a part of the oxide layer includes etching the oxide layer using a plasma etching technique.

5. The process of claim 1, wherein selectively removing a part of the oxide layer includes etching the oxide layer using a hydrofluoric acid solution.

6. The process of claim 1, wherein selectively removing a part of the oxide layer includes etching the oxide layer using a buffered oxide etch technique.

7. The process of claim 1, wherein selectively removing a part of the oxide layer includes reducing a thickness of the oxide layer to about 5 to 15 Å.

8. The process of claim 1, further including forming a gate electrode over the oxide layer after removing the part of the oxide layer.

9. The process of claim 8, further including forming a nitride layer over the oxide layer after removing the part of the oxide layer and before forming the gate electrode.

10. The process of claim 9, wherein forming the nitride layer and removing the part of the oxide layer are performed in-situ.

11. The process of claim 1, wherein forming the oxide layer and selectively removing a part of the oxide layer are performed in-situ.

12. The process of claim 1, wherein selecting a nitrogen-bearing species includes selecting NO.

13. The process of claim 12, wherein the desired depth-distribution of nitrogen is a Gaussian distribution.

14. The process of claim 13, wherein selectively removing a part of the oxide layer provides a resultant depth-distribution of nitrogen which has a maximum concentration of nitrogen at a top surface of the oxide.

15. The process of claim 1, wherein selecting a nitrogen-bearing species includes selecting $N_2O$.

16. The process of claim 15, wherein the desired depth-distribution of nitrogen has a maximum concentration of nitrogen at a surface of the oxide adjacent the substrate.

17. The process of claim 16, wherein selectively removing a part of the oxide layer includes providing a resultant depth-distribution of nitrogen which has a maximum concentration of nitrogen at a surface of the oxide adjacent the substrate.

18. A process of fabricating a semiconductor device, comprising:

forming, in a reaction chamber, an oxide layer including nitrogen-bearing species on a substrate; and selectively removing a part of the oxide layer in the same reaction chamber.

19. The process of claim 18, wherein forming an oxide layer includes forming an oxide layer using one or more of N, $N_2$, NO, $N_2O$, and $NH_3$.

20. The process of claim 18, wherein forming the oxide layer includes growing oxide over the substrate in an ambient containing the nitrogen-bearing species.

21. The process of claim 18, wherein selectively removing a part of the oxide layer includes etching the oxide layer.

22. The process of claim 18, wherein selectively removing a part of the oxide layer includes reducing a thickness of the oxide layer to about 5 to 15 Å.

23. The process of claim 18, further including forming a gate electrode over the oxide layer after removing the part of the oxide layer.

24. The process of claim 23, further including forming a nitride layer over the oxide layer after removing the part of the oxide layer and before forming the gate electrode.

25. The process of claim 23, wherein forming the nitride layer and removing the part of the oxide layer are performed in the same reaction chamber.

26. The process of claim 18, wherein forming the oxide layer includes selecting the nitrogen-bearing species based on a depth-distribution of nitrogen in the oxide layer provided by the nitrogen-bearing species.

* * * * *